United States Patent
Chae

(10) Patent No.: US 11,923,022 B2
(45) Date of Patent: Mar. 5, 2024

(54) STORAGE DEVICE AND OPERATING METHOD FOR CONTROLLER

(71) Applicant: SK hynix Inc., Gyeonggi-do (KR)

(72) Inventor: Chol Su Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/961,380

(22) Filed: Oct. 6, 2022

(65) Prior Publication Data
US 2023/0130533 A1     Apr. 27, 2023

(30) Foreign Application Priority Data

Oct. 27, 2021   (KR) .................... 10-2021-0144681
Aug. 30, 2022   (KR) .................... 10-2022-0108968

(51) Int. Cl.
| | |
|---|---|
| G11C 29/10 | (2006.01) |
| G11C 16/04 | (2006.01) |
| G11C 16/10 | (2006.01) |
| G11C 29/50 | (2006.01) |

(52) U.S. Cl.
CPC .............. *G11C 29/10* (2013.01); *G11C 16/10* (2013.01); *G11C 29/50004* (2013.01); *G11C 16/0483* (2013.01); *G11C 2029/5004* (2013.01)

(58) Field of Classification Search
CPC ... G11C 29/10; G11C 16/10; G11C 29/50004; G11C 16/0483; G11C 2029/5004; G11C 8/04; G11C 16/08; G11C 16/3459; G11C 16/3427
See application file for complete search history.

(56) References Cited

U.S. PATENT DOCUMENTS

| | | | |
|---|---|---|---|
| 8,194,338 B1* | 6/2012 | Zhang .................... | G11B 27/36 360/31 |
| 2004/0062101 A1* | 4/2004 | Kasuga .................. | G11C 7/065 257/E27.099 |
| 2016/0180945 A1* | 6/2016 | Ng ........................ | G11C 15/046 365/185.11 |

FOREIGN PATENT DOCUMENTS

KR       10-1660049 B1       9/2016

\* cited by examiner

*Primary Examiner* — Cynthia Britt
(74) *Attorney, Agent, or Firm* — IP & T GROUP LLP

(57) ABSTRACT

A storage device includes a memory including a plurality of regions arranged along a first axis and a second axis orthogonal to each other, each of the plurality of regions belonging to one of first groups and one of second groups; and a controller configured to, when a programmed and weak region exists, put into a scan list on the basis of a weak list, a programmed and weak sub-region included in the programmed and weak region among the plurality of regions, put into the scan list, a first programmed and adjacent sub-region in a first programmed and adjacent region selected according to a second axis expansion order among the plurality of regions, and put into the scan list, a second programmed and adjacent sub-region in a second programmed and adjacent region selected according to a first axis expansion order among the plurality of regions.

20 Claims, 9 Drawing Sheets

FIG. 5A

WKL_RTS

| PRIORITY | WEAK PAGE |
|---|---|
| 1 | MR43_LSB |
| 2 | MR536_LSB |
| 3 | MR794_LSB |
| 4 | MR608_LSB |
| 5 | MR1251_LSB |
| 6 | MR94_LSB |
| 7 | MR1014_LSB |
| 8 | MR813_LSB |
| 9 | MR938_LSB |
| 10 | MR652_LSB |

FIG. 5B

WKL_RDD

| PRIORITY | WEAK PAGE |
|---|---|
| 1 | MR33_MSB |
| 2 | MR216_MSB |
| 3 | MR83_MSB |
| 4 | MR16_MSB |
| 5 | MR441_MSB |
| 6 | MR92_MSB |
| 7 | MR41_MSB |
| 8 | MR65_MSB |

STORAGE DEVICE AND OPERATING METHOD FOR CONTROLLER

CROSS-REFERENCES TO RELATED APPLICATION

The present application claims priority under 35 U.S.C. § 119(a) to Korean application number 10-2021-0144681, filed on Oct. 27, 2021 and Korean application number 10-2022-0108968, filed on Aug. 30, 2022, in the Korean Intellectual Property Office, which are incorporated herein by reference in their entirety.

BACKGROUND

1. Technical Field

Embodiments of the present disclosure relate to a storage device and an operating method for a controller.

2. Related Art

A storage device is a device for storing data on the basis of a request from a computer, a mobile terminal such as a smart phone and a tablet, or a host such as various electronic devices.

The storage device may further include a controller for controlling a memory (for example, a volatile memory/a non-volatile memory), and such a controller may receive a command from the host and perform or control operations for reading, writing, or erasing data on the memory included in the storage device, on the basis of the received command.

The data may be gradually damaged for various reasons while being stored in the memory. The controller of the storage device may perform a scan operation in order to check whether the data stored in the memory has been damaged. When it is determined through the scan operation that the data has been significantly damaged, the controller may store the data again in a new location before the data is completely and irretrievably damaged.

SUMMARY

Various embodiments of the present disclosure are directed to providing a storage device capable of effectively selecting weak sub-regions where a scan operation is to be performed, and an operating method for a controller.

In an aspect, embodiments of the present disclosure may provide a storage device including: a memory including a plurality of regions arranged along a first axis and a second axis orthogonal to each other, each of the plurality of regions belonging to one of first groups and one of second groups, each of the first groups including regions arranged side by side in a direction of the first axis, each of the second groups regions including regions arranged side by side in a direction of the second axis; and a controller configured to, when a programmed and weak region exists, put into a scan list on the basis of a weak list, a programmed and weak sub-region included in the programmed and weak region among the plurality of regions, put into the scan list, a first programmed and adjacent sub-region in a first programmed and adjacent region selected according to a second axis expansion order among the plurality of regions, and put into the scan list, a second programmed and adjacent sub-region in a second programmed and adjacent region selected according to a first axis expansion order among the plurality of regions.

In another aspect, embodiments of the present disclosure may provide an operating method for a controller including: when a programmed and weak region exists, putting into a scan list on the basis of a weak list, a programmed and weak sub-region included in the programmed and weak region among a plurality of regions arranged along a first axis and a second axis orthogonal to each other, each of the plurality of regions belonging to one of first groups and one of second groups, each of the first groups including regions arranged side by side in a direction of the first axis, each of the second groups including regions arranged side by side in a direction of the second axis; putting into the scan list, a first programmed and adjacent sub-region in a first programmed and adjacent region selected according to a second axis expansion order among the plurality of regions; and putting into the scan list, a second programmed and adjacent sub-region in a second programmed and adjacent region selected according to a first axis expansion order among the plurality of regions.

In further another aspect, embodiments of the present disclosure may provide a storage device including: a memory including a plurality of regions arranged along a first axis and a second axis orthogonal to each other; and a controller configured to perform a scan operation on a weak sub-region in a weak region among the plurality of regions and a predetermined type of sub-region selected from adjacent regions arranged side by side with the weak region.

In further another aspect, embodiments of the present disclosure may provide a storage device including: rows and columns of memory cell groups, each row being coupled to a corresponding word line and memory cells configuring one or more logical pages within each of the groups; and a controller configured to: select at least one programmed and weak logical page within a selected one of the groups, the selected group being programmed, select at least one programmed logical page within each of one or more adjacent ones to the selected group among the groups, the adjacent groups being disposed in a row direction and programmed, and scan the selected pages.

In further another aspect, embodiments of the present disclosure may provide a storage device including: rows and columns of memory cell groups, each row being coupled to a corresponding word line and memory cells configuring one or more logical pages within each of the groups; and a controller configured to: select at least one programmed and weak logical page within a selected one of the groups, the selected group being programmed, select at least one programmed logical page within each of one or more adjacent ones to the selected group among the groups, the adjacent groups being disposed in a column direction and programmed, and scan the selected pages.

In further another aspect, embodiments of the present disclosure may provide an operating method for a controller including: selecting at least one programmed and weak logical page within a selected one of memory cell groups arranged in rows and columns, each row being coupled to a corresponding word line, memory cells configuring one or more logical pages within each of the groups and the selected group being programmed; selecting at least one programmed logical page within each of one or more adjacent ones to the selected group among the groups, the adjacent groups being disposed in a row direction and programmed; and scanning the selected pages.

In further another aspect, embodiments of the present disclosure may provide an operating method for a controller including: selecting at least one programmed and weak logical page within a selected one of memory cell groups arranged in rows and columns, each row being coupled to a corresponding word line, memory cells configuring one or more logical pages within each of the groups and the selected group being programmed; selecting at least one programmed logical page within each of one or more adjacent ones from the selected group among the groups, the adjacent groups being disposed in a column direction and programmed; and scanning the selected pages.

According to embodiments of the present disclosure, weak sub-regions where a scan operation is to be performed may be effectively selected.

BRIEF DESCRIPTION OF THE DRAWINGS

FIG. 5A and FIG. 5B are diagrams illustrating weak lists in accordance with an embodiment of the present disclosure.

DETAILED DESCRIPTION

Figure 1:
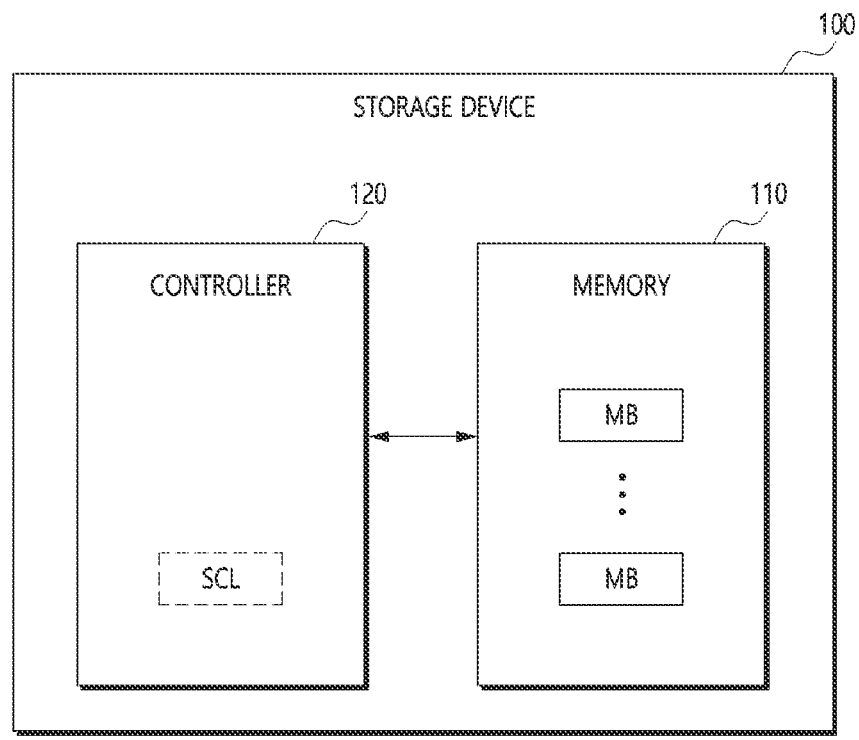
FIG. 1 is a block diagram illustrating a storage device in accordance with an embodiment of the present disclosure.

In the present disclosure, advantages, features and methods for achieving them will become more apparent after a reading of the following embodiments taken in conjunction with the accompanying drawings. The present disclosure may, however, be embodied in different forms and should not be construed as being limited to the embodiments set forth herein. Rather, these embodiments are provided to describe the present disclosure in detail to the extent that a person skilled in the art to which the disclosure pertains can easily enforce the technical concept of the present disclosure.

It is to be understood herein that embodiments of the present disclosure are not limited to the particulars shown in the drawings and that the drawings are not necessarily to scale and in some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present disclosure.

As used herein, the term "and/or" includes any and all combinations of one or more of the associated listed items.

It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, an embodiment of the present disclosure will be described in detail with reference to the accompanying drawings.

FIG. 1 is a block diagram illustrating an exemplary storage device 100 in accordance with an embodiment of the present disclosure.

The storage device 100 may be configured to store data received from an external device, in response to a write request from the external device. The storage device 100 may also be configured to provide the stored data to the external device in response to a read request from the external device.

The storage device 100 may include a personal computer memory card international association (PCMCIA) card, a compact flash (CF) card, a smart media card, a memory stick, various multimedia cards (MMC, eMMC, RS-MMC, and MMC-micro), a secure digital (SD) card (SD, Mini-SD, and Micro-SD), a universal flash storage (UFS), or a solid state drive (SSD).

The storage device 100 may include a memory 110 and a controller 120.

The memory 110 includes a plurality of memory blocks MB and operates in response to the control of the controller 120. The operation of the memory 110 may include, for example, a read operation, a program operation (also referred to as a "write operation"), and an erase operation.

The memory 110 may include a memory cell array including a plurality of memory cells (simply referred to as "cells") for storing data. Such a memory cell array may exist in a memory block MB.

The memory 110 may include a plurality of regions arranged along a first axis and a second axis orthogonal to each other. Each of the plurality of regions may belong to one of first groups and one of second groups. Each of the first groups may include regions arranged side by side in the direction of the first axis. Each of the second groups may include regions arranged side by side in the direction of the second axis. The plurality of first groups may be connected to different word lines, respectively, and regions included in each of the plurality of second groups may be connected to different word lines, respectively. The structure of the plurality of regions will be described in detail with reference to FIG. 3.

The memory 110 may be implemented in various types such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

The memory 110 may be implemented as a three-dimensional array structure. Embodiments of the present disclosure may be applied not only to a flash memory in which a charge storage layer is configured as a conductive floating gate, but also to a charge trap flash (CTF) in which the charge storage layer is configured as an insulating film.

The memory 110 may receive a command, an address, and the like from the controller 120, and access a region of the memory cell array, which is selected by the address. That is, the memory 110 may perform an operation, which is indicated by the command, on the region selected by the address.

For example, the memory 110 may perform a program operation, a read operation, an erase operation, and the like. In this regard, when performing the program operation, the memory 110 may program data in the region selected by the address. When performing the read operation, the memory 110 may read data from the region selected by the address. During the erase operation, the memory 110 may erase data stored in the region selected by the address.

The controller 120 may control overall operations of the storage device 100. The controller 120 may control the memory 110 in order to perform a foreground operation according to a request from an external device. The foreground operation may include an operation of writing data to the memory 110 according to a write request from the external device and reading data from the memory 110 according to a read request from the external device.

The controller 120 may also control the memory 110 in order to perform an internally necessary background operation independently of the external device, that is, even without receiving a request from the external device. The background operation may include at least one of a wear leveling operation, a garbage collection operation, an erase operation, a read reclaim operation, and a refresh operation for the memory 110. The background operation may include an operation of writing data to the memory 110 and reading data from the memory 110 like the foreground operation even without a request from the external device.

The controller 120 may perform a scan operation. The controller 120 may test-read one or more scan pages (or sub-regions) selected from a certain memory block MB, and determine how many read data includes an error. When it is determined that the read data includes a severe error, the controller 120 may move all data or some insecure data stored in the memory block MB to a new memory block MB. The controller 120 may determine a scan list SCL including scan pages on which a scan operation is to be performed.

Specifically, on the basis of a weak list, the controller 120 may put a programmed and weak page (or a programmed and weak sub-region) included in a programmed and weak region among a plurality of regions into the scan list SCL, put a first programmed and adjacent page (or a first programmed and adjacent sub-region) in a first programmed and adjacent region selected according to a second axis expansion order among the plurality of regions into the scan list SCL, and put a second programmed and adjacent page (or a second programmed and adjacent sub-region) in a second programmed and adjacent region selected according to a first axis expansion order among the plurality of regions into the scan list SCL.

According to an embodiment, the controller 120 may select a scan mode from a plurality of scan modes, and select a weak list corresponding to the selected scan mode from a plurality of weak lists respectively corresponding to the plurality of scan modes. According to an embodiment, the plurality of scan modes may include a retention scan mode and a read disturb scan mode.

According to an embodiment, the first axis expansion order may be an order of selecting the second programmed and adjacent page from a predetermined number of adjacent regions included in the same first group as the programmed and weak region among the plurality of regions and most adjacent to the programmed and weak region, the programmed and weak region being included in the scan list SCL. According to an embodiment, the second axis expansion order may be an order of selecting the first programmed and adjacent page from a predetermined number of adjacent regions included in the same second group as the programmed and weak region among the plurality of regions and most adjacent to the programmed and weak region, the programmed and weak region being included in the scan list SCL.

According to an embodiment, when the programmed and weak region does not exist among the plurality of regions, the controller 120 may put a predetermined type of pages (or sub-regions) in programmed regions into the scan list SCL according to a reverse order of a program order.

According to an embodiment, when the number of programmed and weak pages included in the scan list SCL is equal to a predetermined number, the controller 120 may skip putting the first programmed and adjacent page and the second programmed and adjacent page into the scan list SCL. According to an embodiment, when the number of programmed and weak pages included in the scan list SCL and the number of first programmed and adjacent pages selected according to the second axis expansion order are each equal to a predetermined number, the controller 120 may skip putting the second programmed and adjacent page into the scan list SCL.

According to an embodiment, the controller 120 may select, as the programmed and weak page, a page from logical pages (or sub-regions) included in the programmed and weak region, the page being read by using the highest read voltage. According to an embodiment, the controller 120 may select, as the programmed and weak page, a page from logical pages included in the programmed and weak region, the page being read by using the lowest read voltage.

Figure 2:
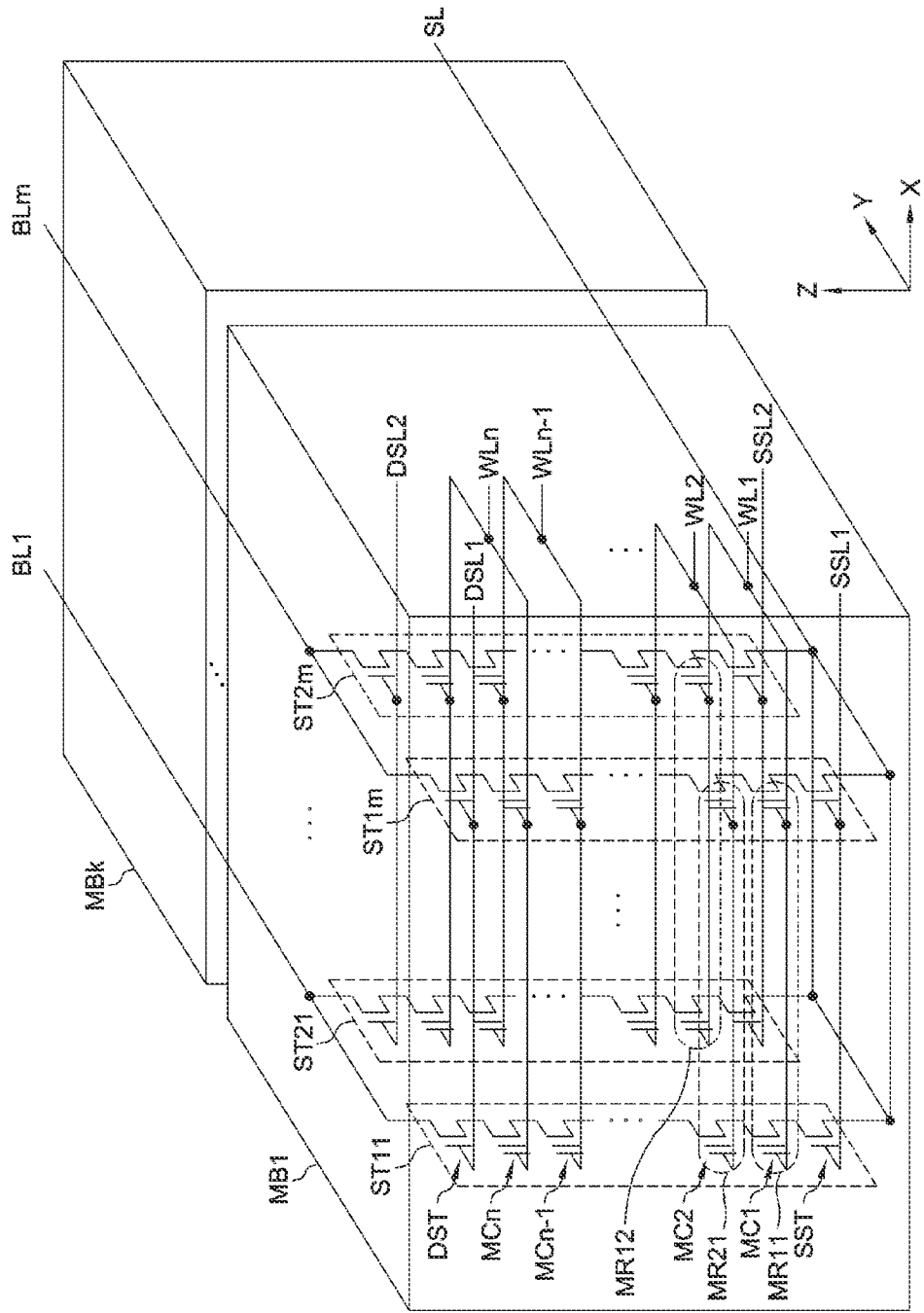
FIG. 2 is a circuit diagram illustrating a memory block in accordance with an embodiment of the present disclosure.

FIG. 2 is a circuit diagram illustrating a memory block MB1 in accordance with an embodiment of the present disclosure. Each of the memory blocks MB in FIG. 1 may be configured similarly to the memory block MB1 in FIG. 2.

Referring to FIG. 2, the memory block MB1 may include strings ST11 to ST1m and ST21 to ST2m. Each of the strings ST11 to ST1m and ST21 to ST2m may extend in a vertical direction (Z direction). In the memory block MB1, m strings may be arranged in a row direction (X direction). FIG. 2 illustrates that two strings are arranged in a column direction (Y direction), but this is for convenience of description and three or more strings may be arranged in the column direction (Y direction).

The strings ST11 to ST1m and ST21 to ST2m may have substantially the same configuration. For example, the string ST11 may include a source select transistor SST, memory cells MC1 to MCn, and a drain select transistor DST connected in series to one another between a source line SL and a bit line BL1. A source of the source select transistor SST may be connected to the source line SL, and a drain of the drain select transistor DST may be connected to the bit line BL1. The memory cells MC1 to MCn may be connected in series to one another between the source select transistor SST and the drain select transistor DST.

Gates of source select transistors of strings arranged in the same row may be connected to the same source select line. For example, gates of source select transistors of the strings ST11 to ST1m in a first row may be connected to a source select line SSL1. Gates of source select transistors of the strings ST21 to ST2m in a second row may be connected to a source select line SSL2. In another embodiment, the source select transistors of the strings ST11 to ST1m and ST21 to ST2m may be connected in common to one source select line.

Gates of drain select transistors of strings arranged in the same row may be connected to the same drain select line. For example, gates of drain select transistors of the strings ST11 to ST1m in the first row may be connected to a drain select line DSL1. Gates of drain select transistors of the strings ST21 to ST2m in the second row may be connected to a drain select line DSL2.

Strings arranged in the same column may be connected to the same bit line. For example, the strings ST11 and ST21 in the first column may be connected to the bit line BL1. The strings ST1m and ST2m in an mth column may be connected to a bit line BLm.

Gates of memory cells located at the same position in a vertical direction may be connected to the same word line. For example, in the strings ST11 to ST1m and ST21 to ST2m, memory cells located at the same position in the vertical direction as the memory cell MC1 may be connected to the word line WL1.

Among the memory cells, memory cells connected to the same word line in the same row may form one region. For example, memory cells connected to the word line WL1 in the first row may form one region MR11. Memory cells connected to the word line WL1 in the second row may form one region MR12. Memory cells connected to a word line WL2 in the first row may form one region MR21. Each word line may be connected to a plurality of regions according to the number of rows. Memory cells forming one region may be programmed at the same time.

According to an embodiment, the memory block MB1 may further include dummy memory cells further connected to one or more dummy word lines other than the word lines WL1 to WLn.

Figure 3:
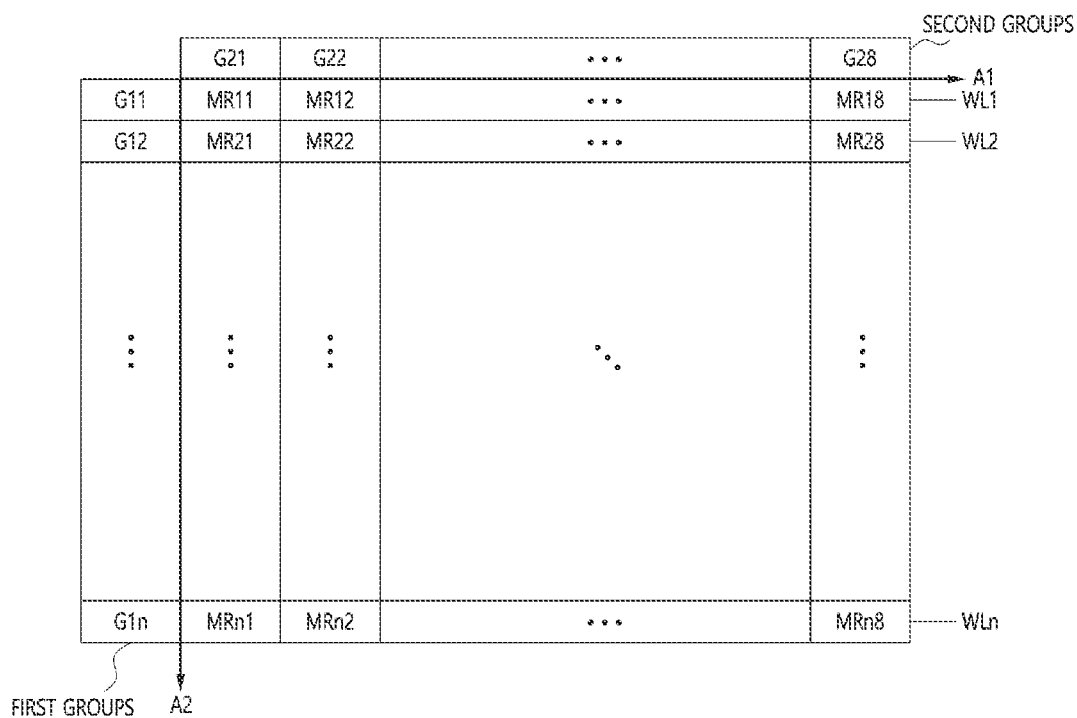
FIG. 3 is a diagram illustrating regions included in the memory block in accordance with an embodiment of the present disclosure.

FIG. 3 is a diagram illustrating regions MR11 to MRn8 included in the memory block MB1 in accordance with an embodiment of the present disclosure. Each of the memory blocks MB in FIG. 1 may be configured similarly to the memory block MB1 in FIG. 3. The regions MR11 to MRn8 may be regions included in the memory block MB1 in FIG. 2.

Referring to FIG. 3, the memory block MB1 may include the regions MR11 to MRn8 arranged along a first axis A1 and a second axis A2 orthogonal to each other. The regions MR11 to MRn8 may be grouped into first groups G11 to G1n and simultaneously grouped into second groups G21 to G28. The fact that the number of second groups G21 to G28 is 8 may be an example.

The first groups G11 to G1n may be arranged in the direction of the second axis A2. The first groups G11 to G1n may be connected to the word lines WL1 to WLn, respectively. Each of the first groups G11 to G1n may include eight regions connected to the same word line. Each of the first groups G11 to G1n may include eight regions arranged side by side in the direction of the first axis A1.

The second groups G21 to G28 may be arranged in the direction of the first axis A1. Each of the second groups G21 to G28 may include n regions as many as the number of word lines WL1 to WLn. Each of the second groups G21 to G28 may include n regions arranged side by side in the direction of the second axis A2.

Eight regions arranged in the direction of the first axis A1 may form one first group. For example, the regions MR11 to MR18 may form a first group G11. The first axis A1 may be, for example, a Y axis in FIG. 2. Eight regions forming one first group may be selectively accessed by controlling corresponding source selection lines, respectively.

The n regions arranged in the direction of the second axis A2 may form one second group. For example, the regions MR11 to MRn1 may form a second group G21. The second axis A2 may be, for example, a Z axis in FIG. 2. The n regions forming one second group may be selectively accessed by controlling the respective word lines WL1 to WLn.

Each of the regions MR11 to MRn8 may include a plurality of memory cells connected to the same word line. For example, the region MR11 may include a plurality of memory cells connected to the word line WL1, and the region MR21 may include a plurality of memory cells connected to the word line WL2.

The program order may refer to an order in which a program operation is performed on the regions MR11 to MRn8. The program operation, for example, may be performed on the first group G11 from the region MR11 to the region MR18, and then may be performed on the first group G12 in the same order, and may be performed on the remaining first groups G13 to G1n in the same order. However, according to an embodiment, the program order may be different from that described above.

When k bits per memory cell are stored, one region formed by the memory cells may logically include k sub-regions, in other words, pages. For example, when the memory cell is a triple level cell (TLC) in which 3 bits are stored per memory cell, the region MR11 may logically include three sub-regions, that is, a least significant bit (LSB) page (or lowest level page) where LSB is stored, a central significant bit (CSB) page (or intermediate level page) where CSB is stored, and a most significant bit (MSB) page (or highest level page) where MSB is stored.

Figure 4:
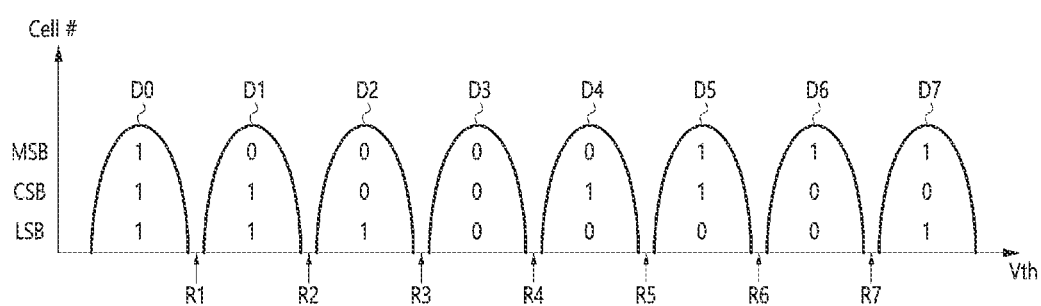
FIG. 4 is a diagram for describing threshold voltage distributions of memory cells in accordance with an embodiment of the present disclosure.

FIG. 4 is a diagram for describing threshold voltage distributions D0 to D7 of memory cells in accordance with an embodiment of the present disclosure. A horizontal axis Vth may indicate a threshold voltage of a memory cell, and a vertical axis Cell # may indicate the number of memory cells having a corresponding threshold voltage.

Referring to FIG. 4, the memory cells forming the threshold voltage distributions D0 to D7 may be, for example, memory cells included in one of the regions MR11 to MRn8 in FIG. 3. The memory cells may form the threshold voltage distributions D0 to D7 according to stored data. In a program operation, each memory cell may be controlled to form one of eight threshold voltage distributions D0 to D7 according to 3-bit data to be stored therein. For example, a memory cell where data "111" is stored may form the threshold voltage distribution D0.

The number of bits stored per memory cell is not limited to three as illustrated in FIG. 4. When k bits per memory cell are stored, the memory cells may form $2^k$ threshold voltage distributions.

When a read voltage is applied to a memory cell through a word line to which the memory cell is connected, the memory cell may be turned on/off according to its own threshold voltage. Specifically, the memory cell may be turned on when a read voltage higher than its own threshold voltage is applied thereto, and may be turned off when a read voltage lower than its own threshold voltage is applied thereto. The memory cell may induce different currents when it is turned on and when it is turned off, and the memory 110 may determine whether the threshold voltage of the memory cell is higher or lower than the read voltage by sensing such currents. Accordingly, when each of read voltages R1 to R7 located between the threshold voltage distributions D0 to D7 (or valleys) is applied to the memory cell, the memory 110 may determine whether the threshold voltage of the memory cell is higher or lower than each of the read voltages R1 to R7. As a result, the memory 110 may determine a threshold voltage distribution, which is formed by the memory cell, by using the read voltages R1 to R7, and read data stored in the memory cell.

For example, LSB data stored in the LSB page may be read using the read voltages R3 and R7. That is, when the memory cell has a threshold voltage lower than the read voltage R3 or higher than the read voltage R7, LSB "1" may be read from the memory cell. When the memory cell has a threshold voltage higher than the read voltage R3 and lower than the read voltage R7, LSB "0" may be read from the memory cell. In a similar principle, CSB data stored in the CSB page may be read using the read voltages R2, R4, and R6. MSB data stored in the MSB page may be read using the read voltages R1 and R5.

On the other hand, the highest threshold voltage distribution D7 has weak retention characteristics, so it may easily move in a direction in which the threshold voltage decreases. In such a case, it may be difficult to clearly distinguish the threshold voltage distributions D6 and D7 by using the read voltage R7. The lowest threshold voltage distribution D0 may be greatly affected by read disturbance and may easily move in a direction in which the threshold voltage increases. In such a case, it may be difficult to clearly distinguish the threshold voltage distributions D0 and D1 by using the read voltage R1. When the threshold voltage distributions D0 to D7 are not accurately distinguished, a read error may occur. From this point of view, a page read using the highest read voltage R7 (LSB page in the example of FIG. 4) may be vulnerable to the retention characteristics. A page read using the lowest read voltage R1 (MSB page in the example of FIG. 4) may be vulnerable to the read disturbance. The page read using the highest read voltage R7 and the page read using the lowest read voltage R1 may be determined differently from the example of FIG. 4 according to the setting of data codes allocated to the threshold voltage distributions D0 to D7.

The above-described scan operation may be performed in a retention scan mode for checking whether the retention characteristics of a page have been weakened and a read disturb scan mode for checking whether a page has been severely affected by the read disturbance. The embodiment may not be limited to the above-described scan modes. The scan page type (or scan sub-region type) of each scan mode may mean a page type of a page to be test-read in each scan mode. For example, when the LSB page is vulnerable to the retention characteristics, the scan page type of the retention scan mode may be determined as the LSB page. For example, when the MSB page is vulnerable to the read disturb characteristics, the scan page type of the read disturb scan mode may be determined as the MSB page.

On the other hand, in each scan mode, it may take too much time to test-read all pages vulnerable to specific characteristics. Accordingly, the controller 120 may determine the scan list SCL including selected scan pages and test-read only scan pages. For example, the controller 120 may perform a test read only on weak pages in weak regions weaker than other regions in the memory block MB. The weak page may mean a scan page type of page included in the weak region. The weak regions of the memory block MB may be weaker than other regions according to location characteristics, process characteristics, and the like. The controller 120 may manage a weak list, which will be described below, to be referred to when determining the scan list SCL.

FIG. 5A and FIG. 5B are diagrams illustrating weak lists WKL_RTS and WKL_RDD in accordance with an embodiment of the present disclosure.

Referring to FIG. 5A, the weak list WKL_RTS may be determined in a manufacturing stage or during operation of the storage device 100. The weak list WKL_RTS may be referred to in a scan operation of the retention scan mode. The weak list WKL_RTS may include weak pages having weak retention characteristics in the memory block MB. In the weak list WKL_RTS, the weak pages may be sorted by priority. The weak pages may be weaker as the priority of the weak list WKL_RTS is higher. In the weak list WKL_RTS, information on each weak page may be included as identification information such as an address. In FIG. 5A, each weak page is represented by a region including each weak page (for example, a weak region) and a page type (for example, a scan page type) of the weak page. For example, a weak page with priority #1 may be an LSB page of a weak region MR43.

Referring to FIG. 5B, the weak list WKL_RDD may be referred to in a scan operation in the read disturb scan mode. The weak list WKL_RDD may include weak pages having weak read disturb characteristics in the memory block MB. The weak list WKL_RDD may be configured similarly to the weak list WKL_RTS in FIG. 5A.

According to an embodiment, two or more scan page types of each scan mode may also be set. For example, when not only the MSB page but also the CSB page are vulnerable to the read disturbance, the scan page types of the read disturb scan mode may be determined as MSB and CSB.

According to an embodiment, the controller 120 may manage a weak list that is applied independently to each memory block MB in FIG. 1. For example, weak pages in a first memory block may be in different locations from weak pages in a second memory block, and the weak list of the first memory block may be different from the weak list of the second memory block. According to an embodiment, the controller 120 may manage a weak list applied in common to two or more memory blocks. For example, the weak pages in the first memory block may be in relatively the same location as the weak pages in the second memory block, and the first memory block and the second memory block may share the same weak list with each other.

In some cases, the controller 120 may perform a scan operation on a partially programmed memory block. In such a case, in the partially programmed memory block, a certain weak page included in the weak list may not yet be in a programmed state, and therefore, the controller 120 will not determine the corresponding weak page as a scan page. Even so, the controller 120 of the present disclosure may efficiently select another scan page, instead of an unprogrammed and weak page, as described below.

Figure 6:
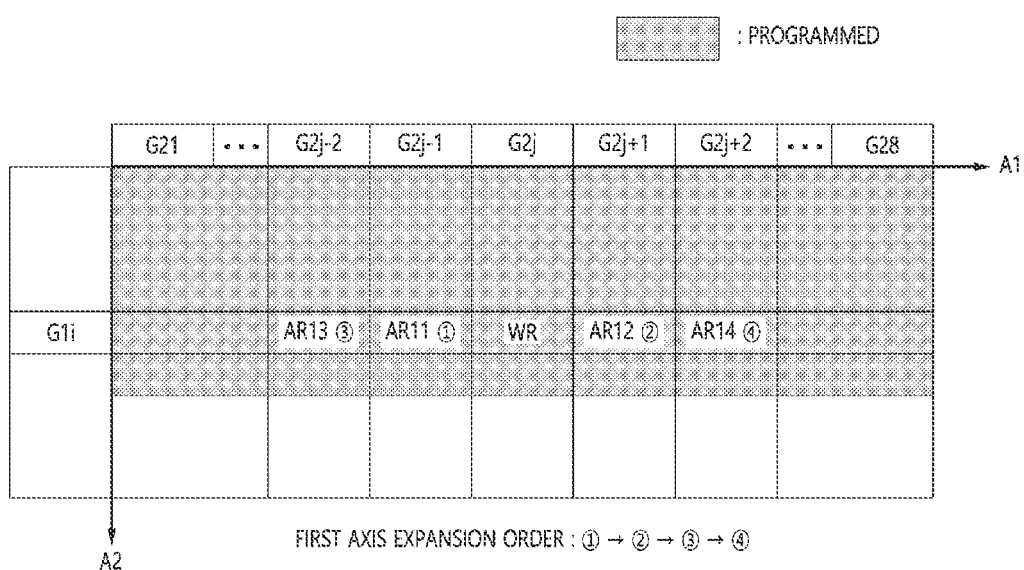
FIG. 6 is a diagram for describing a first axis expansion order in accordance with an embodiment of the present disclosure.

FIG. 6 is a diagram for describing a first axis expansion order in accordance with an embodiment of the present disclosure.

Referring to FIG. 6, the first axis expansion order may mean an order of adjacent regions AR11 to AR14. When a certain weak region WR is included in a first group G1$i$ and a second group G2$j$, the adjacent regions AR11 to AR14 may be four regions included in the first group G1$i$ and most adjacent to the weak region WR. In an arrangement order of the second groups G21 to G28, the adjacent regions AR11 to AR14 may be included in a second group $G2j-1$ before the second group $G2j$ by one, a second group $G2j+1$ behind the second group $G2j$ by one, a second group $G2j-2$ before the second group $G2j$ by two, and the second group $G2j+2$ behind the second group $G2j$ by two, respectively. The adjacent regions AR11 to AR14 may be less weak than the weak region WR, but may be weaker than other regions of the first group $G1i$. The adjacent regions AR11 to AR14 may be weaker in the first axis expansion order.

When a programmed and weak page in the weak region WR is included in the scan list SCL and there is no other programmed and weak page further addable to the scan list SCL, the scan page type of pages in the programmed and adjacent regions AR11 to AR14 may be added to the scan list SCL in the first axis expansion order. Unlike the drawing, when the adjacent region AR14 is not in a programmed state, only the scan page type of pages in the programmed and adjacent regions AR11 to AR13 may be added to the scan list SCL.

According to an embodiment, the first axis expansion order may be set differently from that illustrated in the drawing. According to an embodiment, the first axis expansion order may be expanded to adjacent regions less than or more than four.

Figure 7:
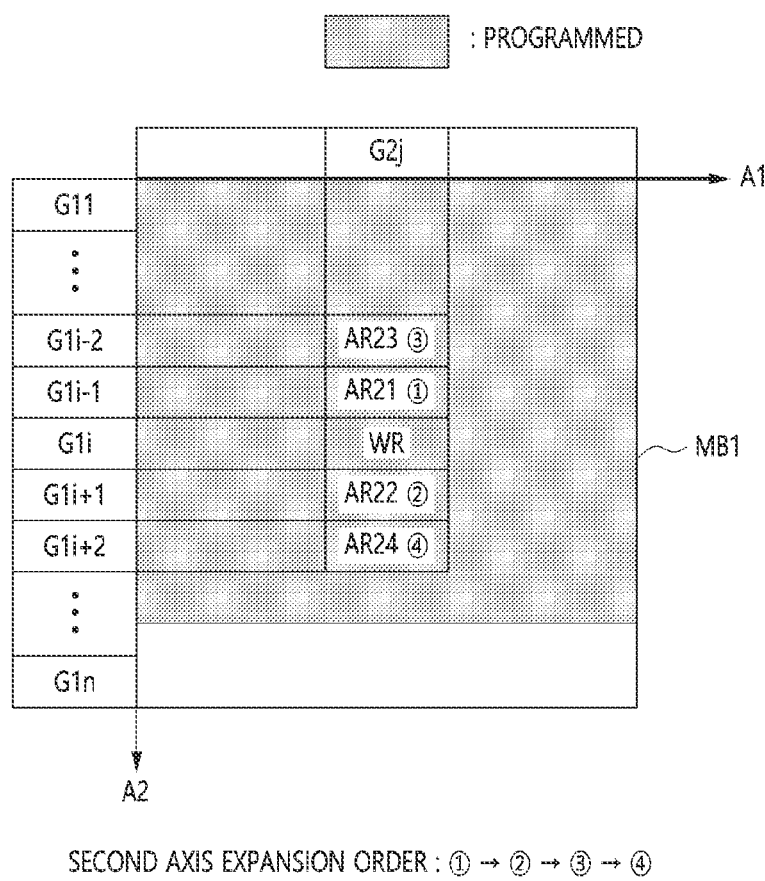
FIG. 7 is a diagram for describing a second axis expansion order in accordance with an embodiment of the present disclosure.

FIG. 7 is a diagram for describing a second axis expansion order in accordance with an embodiment of the present disclosure.

Referring to FIG. 7, the second axis expansion order may mean an order of adjacent regions AR21 to AR24. When a certain weak region WR is included in the first group $G1i$ and the second group $G2j$, the adjacent regions AR21 to AR24 may be four regions included in the second group $G2j$ and most adjacent to the weak region WR as in the weak region WR. In an arrangement order of the first groups G11 to Gin, the adjacent regions AR21 to AR24 may be included in a first group $G1i-1$ before the first group $G1i$ by one, a first group $G1i+1$ behind the first group $G1i$ by one, a first group $G1i-2$ before the first group $G1i$ by two, and the first group $G1i+2$ behind the first group $G1i$ by two, respectively. The adjacent regions AR21 to AR24 may be less weak than the weak region WR, but may be weaker than other regions of the second group $G2j$. The adjacent regions AR21 to AR24 may be weaker in the second axis expansion order.

When a programmed and weak page in the weak region WR is included in the scan list SCL and there is no another programmed and weak page further addable to the scan list SCL, the scan page type of pages in the programmed and adjacent regions AR21 to AR24 may be added to the scan list SCL in the second axis expansion order. Unlike the drawing, when the adjacent regions AR22 and AR24 are not in a programmed state, only the scan page type of pages in the programmed and adjacent regions AR21 and AR23 may be added to the scan list SCL.

According to an embodiment, the second axis expansion order may be set differently from that illustrated in the drawing. According to an embodiment, the second axis expansion order may be expanded to adjacent regions less than or more than four.

Figure 8:
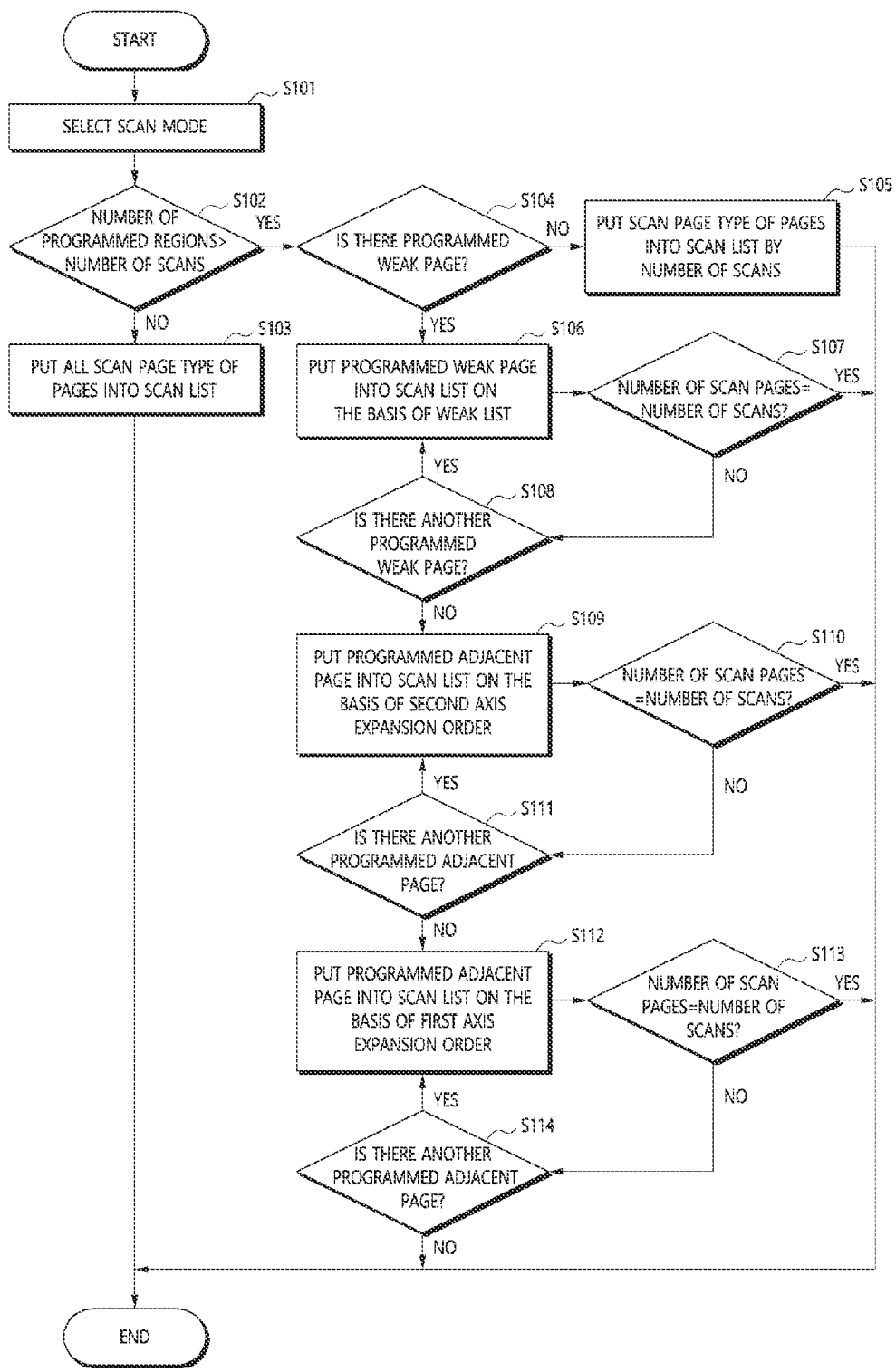
FIG. 8 is a flowchart illustrating a method in which a controller in FIG. 1 determines a scan list in accordance with an embodiment of the present disclosure.

FIG. 8 is a flowchart illustrating a method in which the controller 120 in FIG. 1 determines the scan list SCL in accordance with an embodiment of the present disclosure.

Referring to FIG. 8, in operation S101, the controller 120 may select a scan mode. For example, the scan mode may be selected as one of the retention scan mode and the read disturb scan mode. The controller 120 may select the weak list, the scan page type, and the number of scans according to the scan mode. The number of scans may be the total number of scan pages to be included in the scan list.

In operation S102, the controller 120 may determine whether the number of programmed regions in a memory block exceeds the number of scans. The programmed region may mean a region where data is stored. When it is determined that the number of programmed regions is equal to or less than the number of scans, the procedure may proceed to operation S103. When it is determined that the number of programmed regions exceeds the number of scans, the procedure may proceed to operation S104.

In operation S103, the controller 120 may put all the scan page type of pages included in all programmed regions into the scan list SCL.

In operation S104, on the basis of the weak list, the controller 120 may determine whether at least one programmed and weak page exists. The programmed and weak page may be a page in a programmed state as a weak page included in the weak list. When it is determined that the at least one programmed and weak page does not exist, the procedure may proceed to operation S105. When it is determined that the at least one programmed and weak page exists, the procedure may proceed to operation S106.

In operation S105, the controller 120 may put the scan page type of pages included in the programmed regions into the scan list SCL by the number of scans according to the most recently programmed order (that is, the reverse order of the program order).

In operation S106, the controller 120 may put the programmed and weak page into the scan list SCL on the basis of the weak list.

In operation S107, the controller 120 may determine whether the number of scan pages included in the scan list SCL has reached the number of scans. When it is determined that the number of scan pages has reached the number of scans, the procedure may end. When it is determined that the number of scan pages has not reached the number of scans, the procedure may proceed to operation S108.

In operation S108, on the basis of the weak list, the controller 120 may determine whether there is another programmed and weak page addable to the scan list SCL. When it is determined that there is another programmed and weak page addable to the scan list SCL, the procedure may proceed to operation S106. When operation S106 is repeated, the controller 120 may put a programmed and weak page, which has not yet been included in the scan list SCL, into the scan list SCL. When it is determined that there is no another programmed and weak page addable to the scan list SCL, the procedure may proceed to operation S109.

In operation S109, the controller 120 may put a programmed and adjacent page into the scan list SCL on the basis of the second axis expansion order. The programmed and adjacent page based on the second axis expansion order may mean a scan page type of page included in the same second group as a region (that is, weak region) of the programmed and weak page included in the scan list SCL in step S106 and included in a programmed and adjacent region adjacent to the weak region.

In operation S110, the controller 120 may determine whether the number of scan pages included in the scan list SCL has reached the number of scans. When it is determined that the number of scan pages has reached the number of scans, the procedure may end. When it is determined that the number of scan pages has not reached the number of scans, the procedure may proceed to operation Sill.

In operation S111, on the basis of the second axis expansion order, the controller 120 may determine whether there is another programmed and adjacent page addable to the scan list SCL. When it is determined on the basis of the second axis expansion order that there is another programmed and adjacent page addable to the scan list SCL, the procedure may proceed to operation S109. When operation S109 is repeated, the controller 120 may put a programmed and adjacent page, which has not yet been included in the scan list SCL, into the scan list SCL. When it is determined on the basis of the second axis expansion order that there is no other programmed and adjacent page addable to the scan list SCL, the procedure may proceed to operation S112.

In operation S112, the controller 120 may put the programmed and adjacent page into the scan list SCL on the basis of the first axis expansion order. The programmed and adjacent page based on the first axis expansion order may mean a scan page type of page included in the same first group as the weak region of the programmed and weak page included in the scan list SCL in operation S106 and included in a programmed and adjacent region adjacent to the weak region.

In operation S113, the controller 120 may determine whether the number of scan pages included in the scan list SCL has reached the number of scans. When it is determined that the number of scan pages has reached the number of scans, the procedure may end. When it is determined that the number of scan pages has not reached the number of scans, the procedure may proceed to operation S114.

In operation S114, on the basis of the first axis expansion order, the controller 120 may determine whether there is another programmed and adjacent page addable to the scan list SCL. When it is determined on the basis of the first axis expansion order that there is another programmed and adjacent page addable to the scan list SCL, the procedure may proceed to operation S112. When operation S112 is repeated, the controller 120 may put a programmed and adjacent page, which has not yet been included in the scan list SCL, into the scan list SCL. When it is determined on the basis of the first axis expansion order that there is no other programmed and adjacent page addable to the scan list SCL, the procedure may end.

In FIG. 8, following the first axis expansion order in operation S112 after following the second axis expansion order in operation S109 in order to select a programmed and adjacent page to be added to the scan list may be because a programmed and adjacent page selected according to the second axis expansion order is weaker than a programmed and adjacent page selected according to the first axis expansion order. However, according to an embodiment, the controller 120 may follow the second axis expansion order after following the first axis expansion order first.

Figure 9:
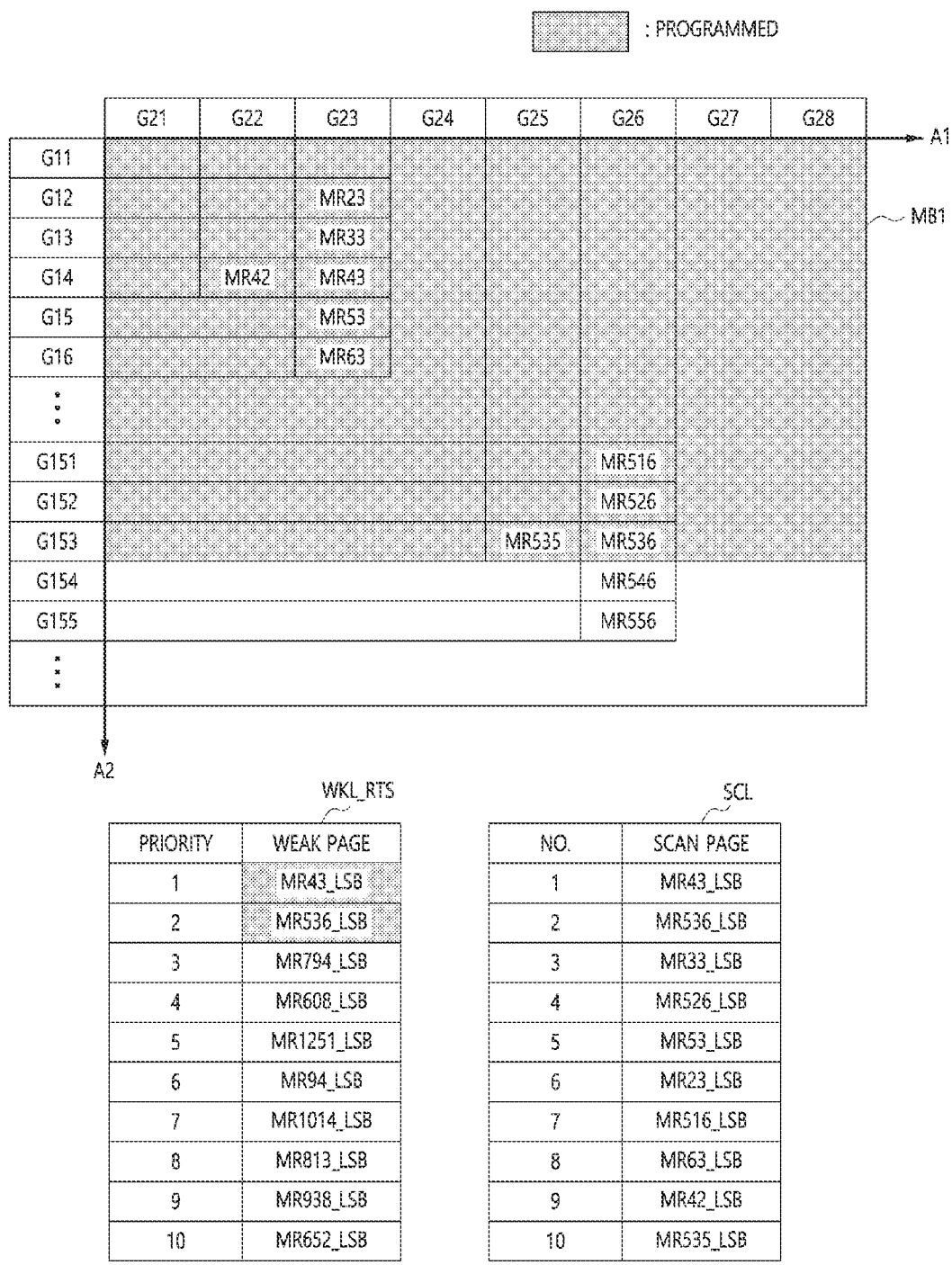
FIG. 9 is a diagram for describing a method in which the controller in FIG. 1 determines a scan list in accordance with an embodiment of the present disclosure.

FIG. 9 is a diagram for describing a method in which the controller 120 in FIG. 1 determines the scan list SCL in accordance with an embodiment of the present disclosure. The controller 120 may operate according to the procedure of FIG. 8.

Referring to FIG. 8 and FIG. 9 together, in operation S101 of FIG. 8, the controller 120 may select a scan mode for the memory block MB1. For example, the controller 120 may select the retention scan mode, select the scan page type as the LSB page, and select the number of scans as 10. The controller 120 may refer to the weak list WKL_RTS corresponding to the retention scan mode. In operation S102, when the memory block MB1 includes 408 (that is, 51*8) programmed regions, the controller 120 may determine that the number of programmed regions exceeds the number of scans. In operation S104, on the basis of the weak list WKL_RTS, the controller 120 may determine that there is at least one programmed and weak page.

In operation S106, on the basis of the weak list WKL_RTS, the controller 120 may put a weak page MR43_LSB programmed once, that is, an LSB page in the weak region MR43 with priority #1 in the weak list WKL_RTS into the scan list SCL as scan page #1. In operation S107, the controller 120 may determine that the number of scan pages included in the scan list SCL has not reached the number of scans. In operation S108, on the basis of the weak list WKL_RTS, the controller 120 may determine that there is another programmed and weak page addable to the scan list SCL.

In operation S106 again, on the basis of the weak list WKL_RTS, the controller 120 may put a weak page MR536_LSB programmed twice, that is, an LSB page in the weak region MR536 with priority #2 in the weak list WKL_RTS into the scan list SCL as scan page #2. In operation S108 after going through operation S107, on the basis of the weak list WKL_RTS, the controller 120 may determine that there is no other programmed and weak page addable to the scan list SCL.

In operation S109, the controller 120 may put a programmed and adjacent page MR33_LSB into the scan list SCL as scan page #3 on the basis of the second axis expansion order. The programmed and adjacent page MR33_LSB may be an LSB page in a programmed and adjacent region MR33, which is included in the same second group G23 as the weak region MR43 of the weak page MR43_LSB programmed once and is adjacent to the weak region MR43. In operation S111 after going through operation S110, on the basis of the second axis expansion order, the controller 120 may determine that there is another programmed and adjacent page addable to the scan list SCL.

In operation S109 again, the controller 120 may put a programmed and adjacent page MR526_LSB into the scan list SCL as scan page #4 on the basis of the second axis expansion order. The programmed and adjacent page MR526_LSB may be an LSB page in a programmed and adjacent region MR526, which is included in the same second group G26 as the weak region MR536 of the weak page MR536_LSB programmed twice and is adjacent to the weak region MR536. Operations S110 and S111 may be repeated similarly to the above.

In operation S109 again, the controller 120 may put a programmed and adjacent page MR53_LSB into the scan list SCL as scan page #5 on the basis of the second axis expansion order. The programmed and adjacent page MR53_LSB may be an LSB page in a programmed and adjacent region MR53, which is included in the same second group G23 as the weak region MR43 of the weak page MR43_LSB programmed once and is adjacent to the weak region MR43. Operations S110 and S111 may be repeated similarly to the above.

In operation S109 again, the controller 120 may put a programmed and adjacent page MR23_LSB into the scan list SCL as scan page #6 on the basis of the second axis expansion order. The programmed and adjacent page MR23_LSB may be an LSB page in a programmed and adjacent region MR23, which is included in the same second group G23 as the weak region MR43 of the weak page MR43_LSB programmed once and is adjacent to the weak region MR43. That is, since an LSB page in a region MR546 has not been programmed yet, it may not be included in the scan list SCL. In this way, the controller 120 may put programmed and adjacent pages MR516_LSB and MR63_LSB into the scan list SCL as scan pages #7 and #8. After putting the scan page #8 into the scan list SCL, in operation S111, the controller 120 may determine that there is no other programmed and adjacent page addable to the scan list SCL, on the basis of the second axis expansion order.

In operation S112, the controller 120 may put a programmed and adjacent page MR42_LSB into the scan list SCL as scan page #9 on the basis of the first axis expansion order. The programmed and adjacent page MR42_LSB may be an LSB page in a programmed and adjacent region MR42, which is included in the same first group G14 as the weak region MR43 of the weak page MR43_LSB programmed once and is adjacent to the weak region MR43. Operations S113 and S114 may be repeated similarly to the above.

In operation S112 again, the controller 120 may put a programmed and adjacent page MR535_LSB into the scan list SCL as scan page #10 on the basis of the first axis expansion order. The programmed and adjacent page MR535_LSB may be an LSB page in a programmed and adjacent region MR535, which is included in the same first group G153 as the weak region MR536 of the weak page MR536_LSB programmed twice and is adjacent to the weak region MR536. In operation S113, the controller 120 may determine that that the number of scan pages included in the scan list SCL has reached the number of scans, and end the determination of the scan list SCL.

Unlike the drawing, according to an embodiment, on the basis of the second axis expansion order, the controller 120 may preferentially put LSB pages of the programmed and adjacent regions MR33, MR53, MR23, and MR63 for the weak region MR43 into the scan list SCL, and then put LSB pages of the programmed and adjacent regions MR526 and MR516 for the weak region MR536 into the scan list SCL.

Figure 10:
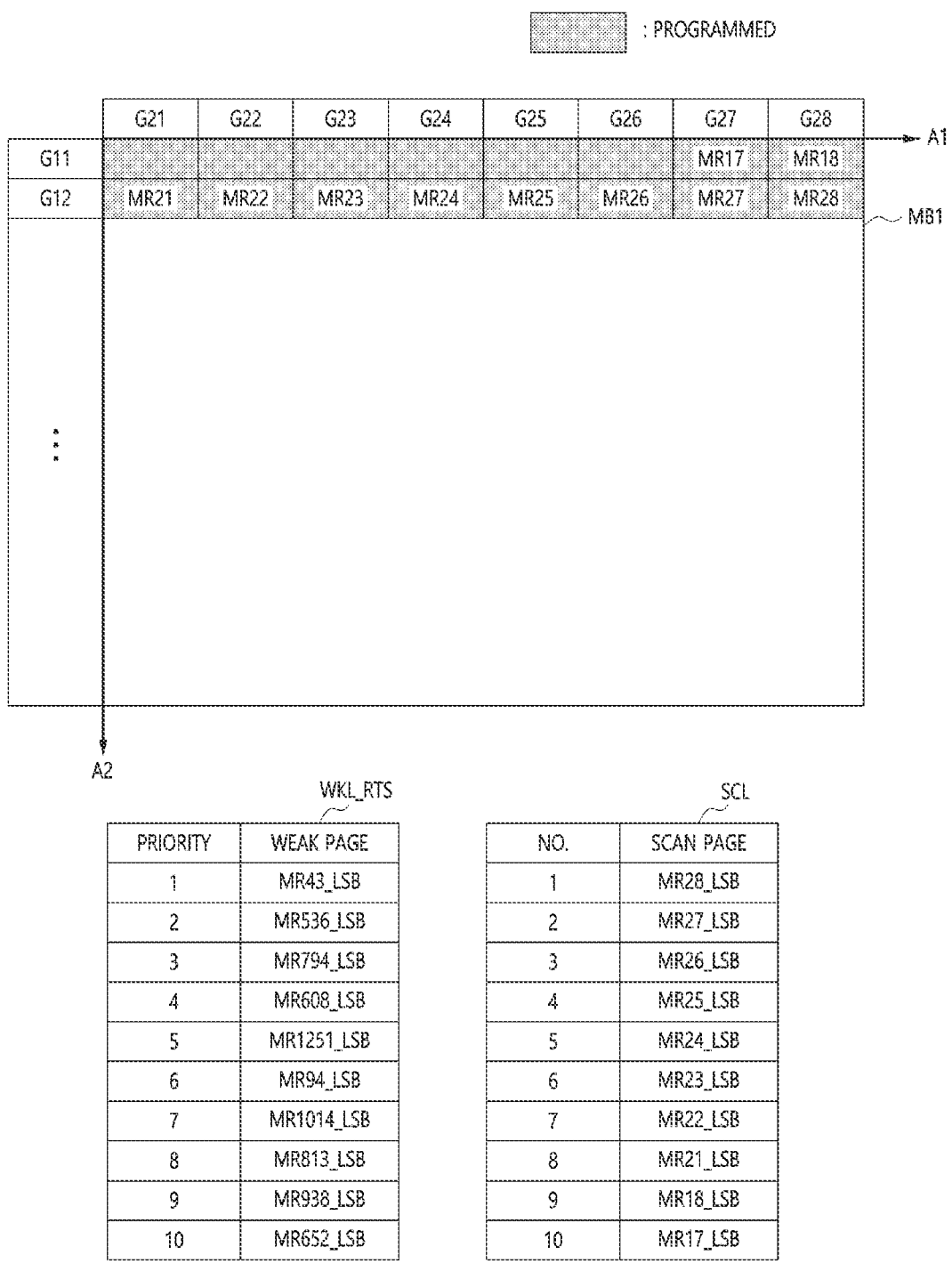
FIG. 10 is a diagram for describing a method in which the controller in FIG. 1 determines a scan list in accordance with an embodiment of the present disclosure.

FIG. 10 is a diagram for describing a method in which the controller 120 in FIG. 1 determines the scan list SCL in accordance with an embodiment of the present disclosure. The controller 120 may operate according to the procedure of FIG. 8.

Referring to FIG. 8 and FIG. 10 together, only the region from MR11 to the region MR28 of the memory block MB1 may be in a programmed state. Operations S101 and S102 may be performed similarly to that described with reference to FIG. 9. In operation S104, on the basis of the weak list WKL_RTS, the controller 120 may determine that there is no programmed and weak page.

In operation S105, the controller 120 may put the LSB pages included in the programmed region MR28 to the programmed region MR17 into the scan list SCL by the number of scans in the reverse order of the program order.

In summary, the controller 120 may efficiently perform the scan operation by appropriately determining the scan list SCL even for the less programmed memory block MB1.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A storage device comprising:
a memory including a plurality of regions arranged along a first axis and a second axis orthogonal to each other, each of the plurality of regions belonging to one of first groups and one of second groups, each of the first groups including regions arranged side by side in a direction of the first axis, each of the second groups including regions arranged side by side in a direction of the second axis; and
a controller configured to, when a programmed and weak region exists, put into a scan list on the basis of a weak list, a programmed and weak sub-region included in the programmed and weak region among the plurality of regions,
put into the scan list, a first programmed and adjacent sub-region in a first programmed and adjacent region selected according to a second axis expansion order among the plurality of regions, and
put into the scan list, a second programmed and adjacent sub-region in a second programmed and adjacent region selected according to a first axis expansion order among the plurality of regions.

2. The storage device according to claim 1, wherein the controller is further configured to select one of a plurality of scan modes, and select a weak list corresponding to the selected scan mode from a plurality of weak lists respectively corresponding to the plurality of scan modes.

3. The storage device according to claim 2, wherein the plurality of scan modes include a retention scan mode and a read disturb scan mode.

4. The storage device according to claim 1, wherein the first axis expansion order is an order of selecting the second programmed and adjacent sub-region from a predetermined number of adjacent regions which are included in the same first group as the programmed and weak region and most adjacent to the programmed and weak region among the plurality of regions.

5. The storage device according to claim 1, wherein the second axis expansion order is an order of selecting the first programmed and adjacent sub-region from a predetermined number of adjacent regions which are included in the same second group as the programmed and weak region and most adjacent to the programmed and weak region among the plurality of regions.

6. The storage device according to claim 1, wherein, when the programmed and weak region does not exist among the plurality of regions, the controller puts a predetermined type of sub-regions in programmed regions into the scan list according to a reverse order of a program order.

7. The storage device according to claim 1, wherein the controller puts the first programmed and adjacent sub-region into the scan list when a number of programmed and weak sub-regions put in the scan list is less than a predetermined number.

8. The storage device according to claim 1, wherein the controller puts the second programmed and adjacent sub-region into the scan list when a sum of programmed and weak sub-regions and first programmed and adjacent sub-regions put in the scan list is less than a predetermined number.

9. The storage device according to claim 1, wherein the controller is further configured to perform a test read operation on the sub-regions put in the scan list.

10. The storage device according to claim 1, wherein the plurality of first groups are connected to respective word lines, and the regions included in each of the plurality of second groups are connected to respective word lines.

11. The storage device according to claim 1, wherein the controller is further configured to select as the programmed and weak sub-region, a sub-region from logical sub-regions included in the programmed and weak region, the selected sub-region being readable by using a highest read voltage of a plurality of read voltages.

12. The storage device according to claim 1, wherein the controller is further configured to select as the programmed and weak sub-region, a sub-region from logical sub-regions included in the programmed and weak region, the selected sub-region being readable by using a lowest read voltage of a plurality of read voltages.

13. An operating method for a controller, the operating method comprising:
when a programmed and weak region exists, putting into a scan list on the basis of a weak list, a programmed and weak sub-region included in the programmed and weak region among a plurality of regions arranged along a first axis and a second axis orthogonal to each other, each of the plurality of regions belonging to one of first groups and one of second groups, each of the first groups including regions arranged side by side in a direction of the first axis, each of the second groups including regions arranged side by side in a direction of the second axis;
putting into the scan list, a first programmed and adjacent sub-region in a first programmed and adjacent region selected according to a second axis expansion order among the plurality of regions; and
putting into the scan list, a second programmed and adjacent sub-region in a second programmed and adjacent region selected according to a first axis expansion order among the plurality of regions.

14. The operating method according to claim 13, further comprising:
selecting one of a plurality of scan modes; and
selecting a weak list corresponding to the selected scan mode from a plurality of weak lists respectively corresponding to the plurality of scan modes.

15. The operating method according to claim 13, wherein the first axis expansion order is an order of selecting the second programmed and adjacent sub-region from a predetermined number of adjacent regions which are included in the same first group as the programmed and weak region and most adjacent to the programmed and weak region among the plurality of regions.

16. The operating method according to claim 13, wherein the second axis expansion order is an order of selecting the first programmed and adjacent sub-region from a predetermined number of adjacent regions which are included in the same second group as the programmed and weak region and most adjacent to the programmed and weak region among the plurality of regions.

17. The operating method according to claim 13, further comprising:
when the programmed and weak region does not exist among the plurality of regions, putting a predetermined type of sub-regions in programmed regions into the scan list according to a reverse order of a program order.

18. The operating method according to claim 13, wherein the first programmed and adjacent sub-region is put into the scan list when a number of programmed and weak sub-regions put in the scan list is less than a predetermined number.

19. The operating method according to claim 13, wherein the second programmed and adjacent sub-region is put into the scan list when a sum of programmed and weak sub-regions and first programmed and adjacent sub-regions put in the scan list is less than a predetermined number.

20. A storage device comprising:
a memory including a plurality of regions arranged along a first axis and a second axis orthogonal to each other; and
a controller configured to perform a scan operation on a weak sub-region in a weak region among the plurality of regions and a predetermined type of sub-region selected from adjacent regions arranged side by side with the weak region.

* * * * *